United States Patent [19]
Jürgensen et al.

[11] Patent Number: 5,348,911
[45] Date of Patent: Sep. 20, 1994

[54] MATERIAL-SAVING PROCESS FOR FABRICATING MIXED CRYSTALS

[75] Inventors: Holger Jürgensen; Klaus Grüter, both of Aachen; Marc Deschler, Hauset; Pieter Balk, Aachen, all of Fed. Rep. of Germany

[73] Assignee: Aixtron GmbH, Fed. Rep. of Germany

[21] Appl. No.: 51,792

[22] Filed: Apr. 26, 1993

Related U.S. Application Data

[63] Continuation of Ser. No. 751,639, Aug. 26, 1991, abandoned, which is a continuation of Ser. No. 563,688, Aug. 3, 1990, abandoned, which is a continuation of Ser. No. 334,108, Feb. 24, 1989, abandoned.

[30] Foreign Application Priority Data

Jun. 30, 1987 [DE] Fed. Rep. of Germany ....... 3721638

[51] Int. Cl.$^5$ .......................................... H01L 21/205
[52] U.S. Cl. .................... 117/91; 427/255.2; 117/954
[58] Field of Search ................. 437/102, 104, 81, 965, 437/128, 133, 126; 148/DIG.64, DIG. 65, DIG. 56; 427/248.1, 252, 255.2; 156/610, 613

[56] References Cited

U.S. PATENT DOCUMENTS

| | | | |
|---|---|---|---|
| 3,391,017 | 7/1968 | Bolger et al. | 437/104 |
| 3,594,242 | 7/1971 | Burd et al. | 437/133 |
| 3,925,119 | 12/1975 | Philbrick et al. | 156/610 |
| 4,253,887 | 3/1981 | Jolly | 148/DIG. 65 |
| 4,407,694 | 10/1983 | Eu et al. | 156/613 |
| 4,422,888 | 12/1983 | Stutius | 156/613 |
| 4,689,094 | 8/1987 | Van Rees et al. | 437/104 |
| 4,801,557 | 1/1989 | Wessels et al. | 437/133 |
| 4,808,551 | 2/1989 | Mori et al. | 437/81 |

FOREIGN PATENT DOCUMENTS

| | | | |
|---|---|---|---|
| 0006118 | 1/1980 | European Pat. Off. | 437/133 |
| 2356271 | 1/1978 | France. | |
| 2501908 | 9/1982 | France. | |
| 58-184721 | 10/1983 | Japan | 437/133 |
| 58-194329 | 11/1983 | Japan | 437/104 |
| 60-187014 | 9/1985 | Japan | 148/DIG. 65 |
| 1042933 | 9/1966 | United Kingdom. | |

OTHER PUBLICATIONS

Seki et al. "A New Vapor Growth Method for GaP Using a Single Flat Temperature Zone", Japan J. Appl. Phys. vol. 12 (1973), No. 7, pp. 1112-1113.

Shaw, "Epitaxial GaAs Kinetic Studies: {001} Orientation", J. Electrochem. Soc.:Solid State Science, May 1970, vol. 117, No. 5, pp. 683-687.

Clough et al., "Vapor-Phase Growth of Epitaxial $GaAs_{1-x}Sb_x$ Alloys Using Arsine and Stibine", Transactions of the Metallurgical Society of AIME, vol. 245, Mar. 1969, pp. 583-585.

Gentner et al., ". . . Low Pressure GaAs VPE in the Chloride System," J. Crys. Growth, 56 (1982), pp. 232-343.

Chatillon et al., ". . . CVD Growth of GaAs Compounds", J. Crys. Growth, 71 (1985), pp. 433-449.

Tietjen et al., ". . . Vapor-Deposited Epitaxial $GaAs_{1-x}P_x$ Using Arsine and Phosphine", J. Electrochem. Soc., vol. 113 No. 7, Jul. 1966, pp. 724-728.

Quinlan et al., ". . . $Ga_x In_{1-x}As$ in the VPE—Hydride Technique . . . ", J. Crys. Growth, 71 (1985), pp. 246-248.

Dazai et al., "Vapor Phase Epitaxial Growth of GaAs in an Nitrogen Atmosphere", Sci. and Technical J., Jun. 1974, vol. 10, No. 2, pp. 125-143.

*Primary Examiner*—R. Bruce Breneman
*Assistant Examiner*—Ourmazd S. Ojan

[57] ABSTRACT

Disclosed is a process for fabricating mixed crystals and, in particular, III-V semiconductors, in which at least one component of the composition of the mixed crystal is transferred in a reactor from a source into a vapor phase containing hydrogen and chloride compounds as well as a carrier gas and mixed with said component or other components of said composition of said mixed crystal, transported to a substrate and precipitated on said substrate. The invented process is distinguished in that in order to vary the growth rate between approximately 1 <m/h and approximately 500 <m/h, the overall pressure is varied between approximately 80 mbar and approximately 1 mbar.

13 Claims, 2 Drawing Sheets

MATERIAL-SAVING PROCESS FOR FABRICATING MIXED CRYSTALS

This application is a continuation of application Ser. No. 07/751,639, filed Aug. 26, 1991, now abandoned, which is a continuation of application Ser. No. 07/563,688, filed Aug. 3, 1990, now abandoned, which is a continuation of application Ser. No. 07/334,108, filed Feb. 24, 1989, now abandoned.

BACKGROUND OF THE INVENTION

The present invention relates to a material-saving process for fabricating mixed crystals and, in particular, III-V semiconductors, in which at least one component of the composition of the mixed crystal is transferred from a source into a vapourphase containing hydrogen and cloride compounds and mixed with the component or the other components of the composition of the mixed crystal, transported to a substrate and precipitated on the substrate.

STATE OF THE ART

Processes as set forth in the introductory part of claim 1 hereto are also referred to as the Tietjen process and are employed particularly if especially high quality and uniformity of the deposited mixed-crystal layers are demanded.

In the past, processes of this kind were used, in particular, for producing III-V semiconductors, such as GaAs, InGaAs, InP layers, but also for fabricating II-VI mixed crystals, whereby usually overall pressure in the reactor was fixed between 100 and 1000 mbar and a growth rate between typically 1 $\mu$m/h and maximumly 30 $\mu$m/h was obtained resulting in the known dependence of the growth rate of the layer on the overall pressure in epitaxial processes, namely a monotone decline in growth with decreasing pressure.

An increase in partial pressure over approximately 1000 mbar results in no substantial rise in the growth rate, but diminishes the quality of the produced layers.

DESCRIPTION OF THE INVENTION

The object of the present invention is to improve a process as put forth in the introductory part of claim 1 hereto in such a manner that high growth rates can be obtained which, while continuing to maintain uniformity and good quality of the mixed crystal, permit profitable production.

A solution and its further embodiments in accordance with the present invention of the aforegoing object is set forth in the claims hereto.

Remarkably, by reducing the overall pressure in the reactor to values distinctly below the previously conventional lower limit for the overall pressure, growth rates are obtained with processes according to the introductory part of claim 1 hereto which can be varied over a wide range up to values lying more than the factor 10 above those that could hitherto be obtained with generic processes.

It is particularly striking, however, that, probably due to different thermodynamic and thermokinetic behavior, the growth rate rises with decreasing overall pressure. Typically, the growth rate can be varied between approximately 1 $\mu$m/h and approximately 500 $\mu$m/h by varying the overall pressure between 80 mbar and approximately 1 mbar.

The invented process does not only have the advantage that high growth rates can be obtained permitting a profitable fabrication of mixed crystals, by way of illustration III-V-semiconductor mixed crystals. Thus the invented process is not only suited for producing thin layers, but also for preparing the substrate on which the thin layers are deposited. As substrate preparation becomes possible in this manner without mechanical processing, very sensitive systems such as InGaAs can also be fabri-cated profitably with the invented process.

Moreover, the layers obtained with the invented process are exceedingly uniform and have excellent electrical and optical properties. Excellent morphology and, in particular, reflecting surfaces are obtained.

Furthermore, the invented process has a high yield so that the use of gases and especially poisonous gases can be substantially reduced. In this way, safety is increased during layer production while at the same time costs are further reduced.

The invented process permits—as already delineated—varying the growth rate by approximately 3 decimal powers by varying the overall pressure by approximately 2 decimal powers. Moreover, the invented process, however, also permits varying the growth rate in a wide range by varying other parameters while maintaining a constant pressure in the invented range. In practice, this is of great significance as, by this means, very exact fixing of the growth rate becomes possible.

Examples hereto are set forth in claims 2 and 4 herein.

In accordance with the present invention, by way of illustration, the HCl partial pressure can be varied between approximately $5*10^{-6}$ bar and approximately $5*10^{-3}$ bar. In this fashion, the growth rate can be varied by more than one decimal power while maintaining a constant overall pressure ( claim 2 hereto).

In processes according to the introductory part of claim 1 hereto, the element or elements of the V. main group are frequently transferred as hydrogen compounds as described in claim 3 hereto.

Claim 4 describes that in such a case the partial pressure of the elements of the V. main group present as hydrogen compounds can be varied between approximately $10^{-4}$ bar and $10^{-2}$ bar by means of which a variation of the growth rate by more than 2 decimal powers is obtained.

The invented process is suited for fabricating III-V mixed crystals as well as for producing II-VI mixed crystals.

In the case of III-V mixed crystals, the component or components of the composition reacting from a source are preferably one or several elements from the III. main group.

If gallium (claim 6 hereto) is employed as the element from the V. main group, the temperature of the source can typically be 600°–750° C.

Particularly remarkable is, however, that nitrogen ($N_2$) or inert gases (helium, argon) may be used as the carrier gas instead of hydrogen ($H_2$) in the invented manner of performing the process. The reason for this is the changed chemical reaction resulting from the invented manner of performing the process, which influenced the precipitation process in such a manner that other gases can be employed instead of hydrogen during epitaxy.

A number of fundamental advantages are yielded by this means for utilization in production processes:

Due to the elimination of hydrogen as the carrier gas, hydrogen gas reactions can no longer occur thereby greatly increasing safety of the system and, in particular, the procedure is no longer explosive.

By employing $N_2$ instead of hydrogen, the consumption costs of the carrier gas (99% of the gas consumption) can be drastically reduced as highly pure hydrogen is substantially more expensive than nitrogen.

While maintaining uniform good morphology, i.e. reflecting surfaces, the growth rates, by way of illustration, in the preparation of GaAs rises approximately 10% if nitrogen is utilized compared to when hydrogen is employed. At the same time the incorporation of impurities sinks by nearly a decimal power so that the background doting lies in the $10^{13}$ cm$^{-3}$ range with a corresponding increase in charge carrier mobility.

BRIEF DESCRIPTION OF THE DRAWING

The present invention is made more apparent in the following section using a preferred embodiment with reference to the accompanying drawing, in which.

DESCRIPTION OF THE PREFERRED EMBODIMENT

In the following section the invented process will be delineated, by way of illustration, for the fabrication of GaAs layers without the intention of limiting the scope or spirit of the overall inventive concept.

Figure 1:
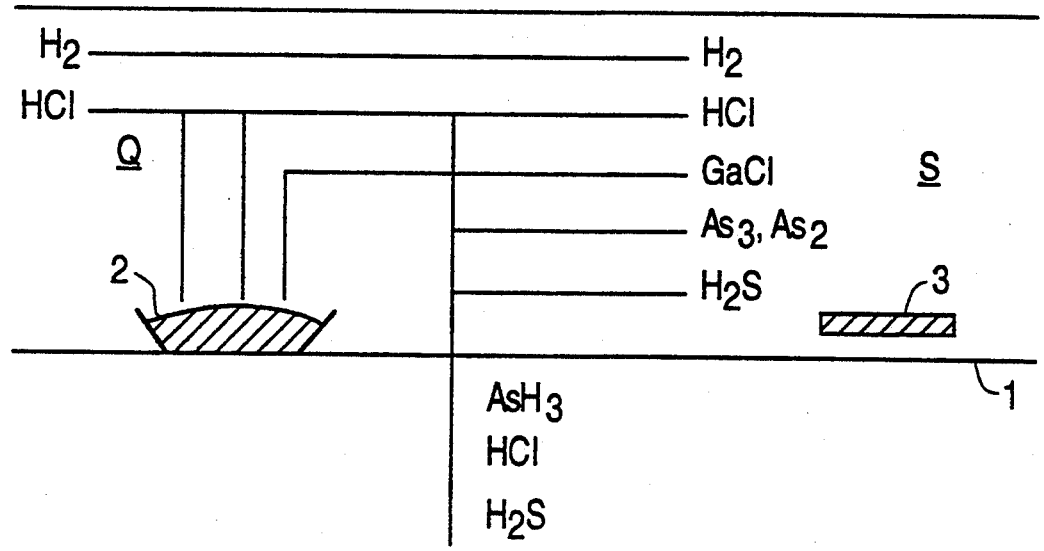
FIG. 1 schematically shows a reactor for performing the invented process.

FIG. 1 schematically depicts a reactor 1 for performing the invented process. In reactor 1 are arranged a gallium source 2 and a substrate 3. Furthermore, inlet lines, not illustrated in detail, are provided for the dosed introduction of $AsH_3$, HCl, $H_2$ or $N_2$ as the carrier gas and $H_2S$ as the doping gas. It is expressly pointed out that the invented process is independent of any special doting so that the following particulars are to be understood as by way of illustration.

Similar results would be obtained if, for example, diethyl zinc is utilized as the doping gas.

Corresponding to the arrangement of the individual elements, the reactor 1 has, in a as such known manner, a source zone Q with a temperature $T_S$ and a substrate zone S with a temperature $T_D$. The individual gas flows in this zone are shown very schematically in FIG. 1.

Figure 2:
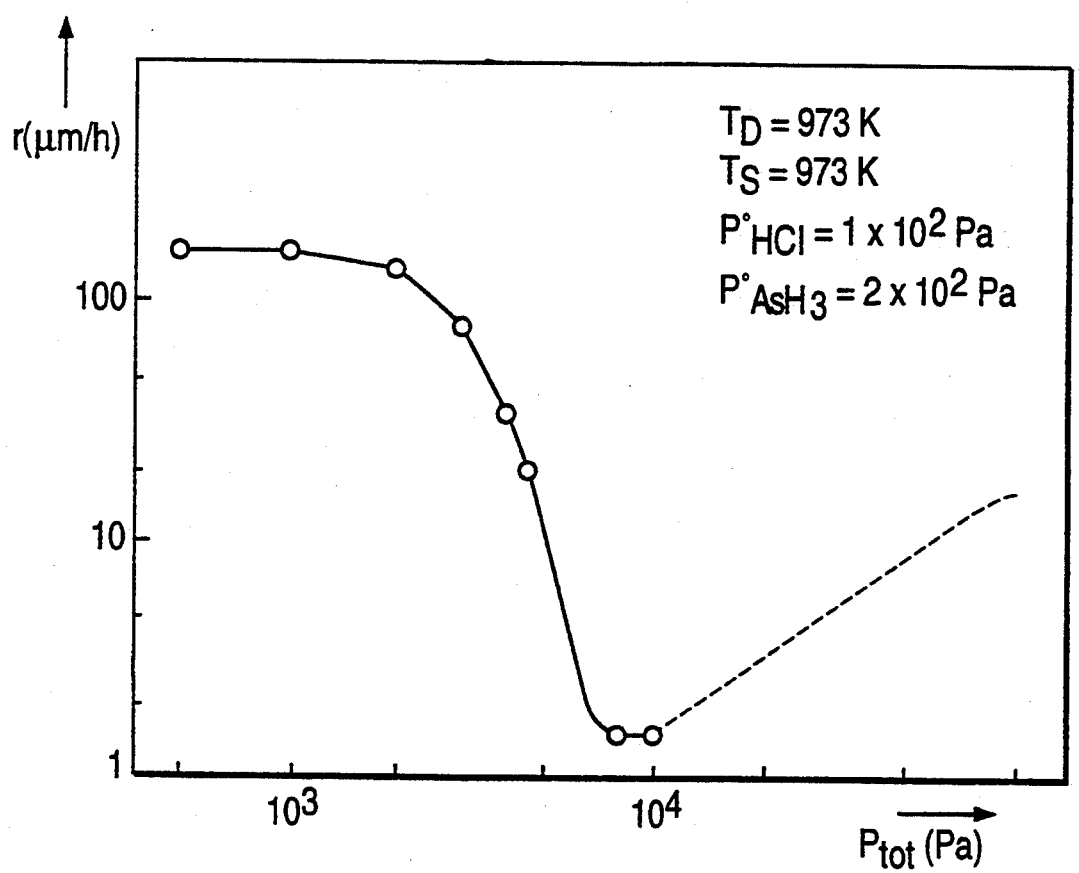
FIG. 2 shows the dependence of the growth rate on the overall pressure.

FIG. 2 depicts the growth rate r in $\mu m/h$ as a function of the overall pressure $P_{tot}$ in Pa ($10^5 pa = 1 bar$) in the following selection of parameters:

Temperature $T_S$ of the source: 973 K
Temperature $T_D$ of the substrate: 973 K
Partial pressure $p_{HCl}$: 100 Pa
Partial pressure $p_{AsH3}$: 200 Pa FIG. 2 indicates that at the conventional overall pressures of $P_{tot}$ 100 mbar ($=10^4 Pa$) the growth rate r diminishes with decreasing pressure. Altold an increase in pressure by one decimal power, results in a rise in growth rate of one decimal power.

At approximately 100 mbar the growth rate is 1–2 $\mu m/h$, a very small value especially for industrial utilization. For this reason, overall pressures below approximately 100 mbar were not considered in the past.

As an inventive element it was, however, discovered that at pressures below 100 mbar the growth rate surprisingly rises steeply again with negative pressure coefficients. The growth rate r does not transcend to a saturation value until a pressure of below 10 mbar, the saturation value typically lying approximately a decimal power higher than the highest growth rate at pressures in the range of approximately 1 bar.

In accordance with the present invention, the growth rate r can not only be varied by varying the overall pressure over a wide range, but also with a constant overall pressure in the selected invented range by varying the partial pressures.

Figure 3:
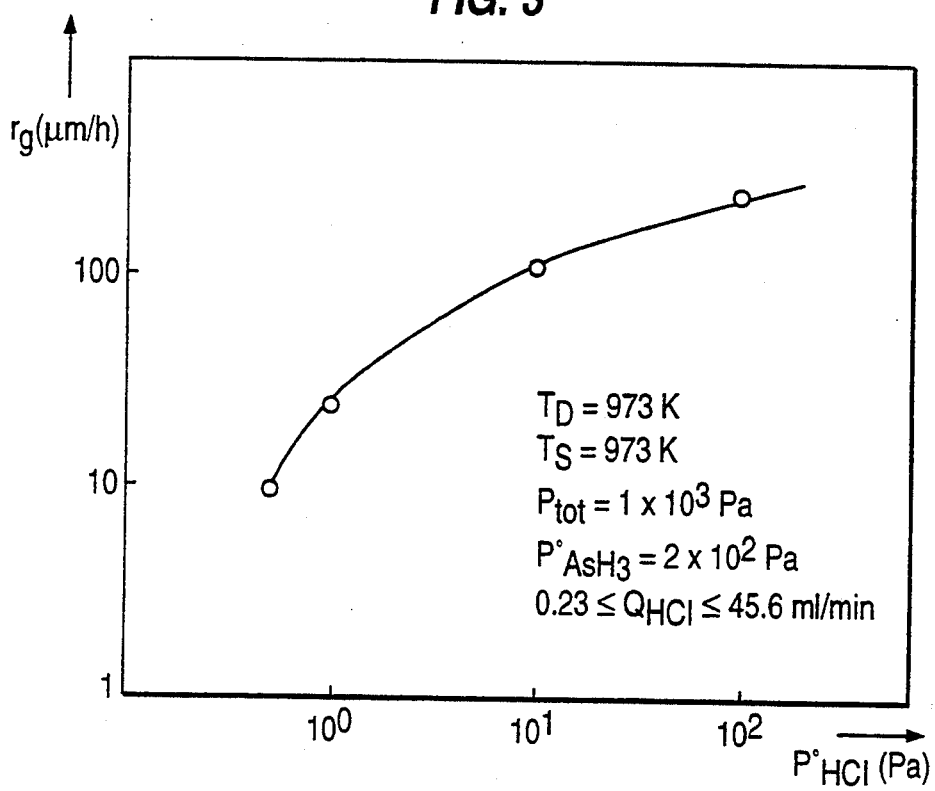
FIG. 3 shows the dependence of the growth rate on the HCl partial pressure.
Figure 4:
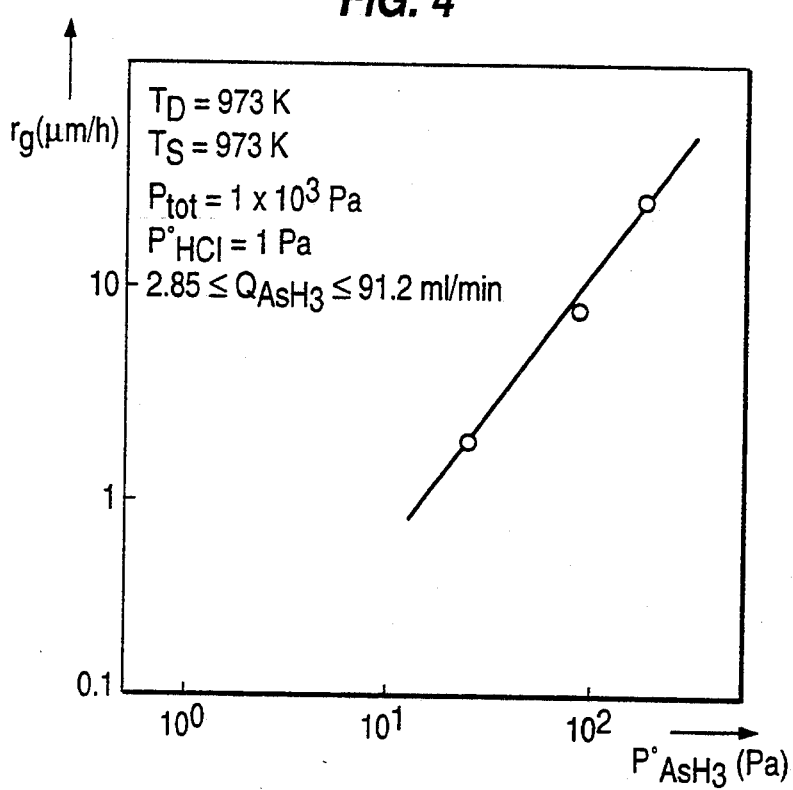
FIG. 4 shows the dependence of the growth rate on the $AsH_3$ partial pressure.

FIGS. 3 and 4 depict examples thereof. Both examples have the following paramenters in common:

$T_D = 973$ K, $T_S = 973$ K, $p_{tot} = 10$ mbar

In the example illustrated in FIG. 3, the growth rate r is shown as a function of the HCl partial pressure and in the example illustrated in FIG. 4 as a function of the $AsH_3$ partial pressure. Furthermore, the volume flow range Q of $AsH_3$ is indicated in ml/min as well as the respective maintained constant partial pressure.

As FIGS. 3 and 4 show, in accordance with the present invention, the growth rate r can be varied even with a very low constant overall pressure of, by way of illustration, 10 mbar and a constant temperature. For example, with the above-given parameters the following values are yielded:

| $p_{HCl}$ | $p_{AsH3}$ | growth rate |
|---|---|---|
| $10^{-5}$ bar | $0,275 * 10^{-3}$ bar | 1.6 $\mu m/h$ |
| $10^{-3}$ bar | $2.0 * 10^{-3}$ bar | 277 $\mu m/h$ |

The aforegoing numerical values are valid when hydrogen ($H_2$) is employed as the carrier gas. By using nitrogen $N_2$ as the carrier gas, the growth rate can be raised by approximately another 10%, particularly in the preparation of GaAs. At the same time the incorporation of impurities sinks by nearly a decimal power so that the attainable background doting lies in the range of $10^{13}$ cm$^{-3}$, charge carrier mobility rising correspondingly.

Similar results are achieved if inert gaes such as helium or argon are utilized as carrier gases.

In the preceding section the present invention was described using preferred embodiments without the intention of limiting the scope or spirit of the overall inventive concept, within which, of course, there are many very varied possible modifications.

In accordance with the invention an overall pressure was worked with, which lay at least the factor 2–3 below the value at which growth rates of less than $< \mu m/h$ are yielded when working in conventional pressure range. This value is approximately 100 mbar with GaAs and may naturally deviate with other layer systems. Furthermore, it is not only possible to fabricate III-V semiconductors, but also II-VI mixed crystals. Moreover, in addition to binary mixed crystals, ternary or quarternary mixed crystals can also be deposited with the invented process.

In any event, layers of excellent quality are obtained with the invented process and with the added advantage that in the industrial production of components having layers or sequences of layers of greatly differing thickness the growth rate can be easily fixed without needing elaborate and complicated apparatuses. Moreover the invented process is very efficient so that there is correspondingly little material consumption. The high growth rate not only permits fabricating thin layers, but also preparing substrates so that the invented process is also suited for producing complicated layers and substrate systems.

What I claim is:

1. A process for fabricating mixed crystals comprising:

transferring at least one component of a composition of the mixed crystal in a reactor from a source into a vapor phase containing hydrogen and chloride compounds, said chloride compounds comprising at least HCl, a carrier gas, and said component;

transporting the vapor phase to a substrate;

precipitating the vapor phase on said substrate; and varying a growth rate between 1 $\mu$m/h and 500 $\mu$m/h, wherein the step of varying the growth rate includes the steps of varying the overall pressure of the vapor phase between 80 mbar and 1 mbar, and varying the HCl partial pressure in the vapor phase between $5*10^{-6}$ bar and $5*10^{-3}$ bar.

2. A process according to claim 1, wherein the V main group element or elements are added as hydrogen compounds.

3. A process according to claim 2, wherein the partial pressure of said V main group elements present as hydrogen compounds is varied between $10^{-4}$ bar and $10^{-2}$ bar.

4. A process according to claim 1, wherein said component vaporized from a source is a III main group element.

5. A process according to claim 4, wherein said element is gallium.

6. A process according to claim 1, wherein the temperature of said source is 700° C.

7. A process according to claim 1, wherein said carrier gas is $N_2$.

8. A process according to claim 1, wherein the V main group element or elements are added as hydrogen compounds.

9. A process according to claim 8, wherein the partial pressure of said V main group elements present as hydrogen compounds is varied between $10^{-4}$ bar and $10^{-2}$ bar.

10. A process according to claim 9, wherein said component vaporized from a source is a III main group element.

11. A process according to claim 10, wherein said element is gallium.

12. A process according to claim 11, wherein the temperature of said source is 700° C.

13. A process according to claim 12, wherein said carrier gas is $N_2$.

* * * * *

UNITED STATES PATENT AND TRADEMARK OFFICE
CERTIFICATE OF CORRECTION

PATENT NO. : 5,348,911
DATED : Sept. 20, 1994
INVENTOR(S) : Jürgensen et al.

It is certified that error appears in the above-indentified patent and that said Letters Patent is hereby corrected as shown below:

In the Abstract, lines 11 and 12, please change "<m/h" to --$\mu$m/h--.

Signed and Sealed this

Sixteenth Day of May, 1995

BRUCE LEHMAN

*Attest:*

*Attesting Officer*   *Commissioner of Patents and Trademarks*